United States Patent
Ha et al.

(10) Patent No.: US 7,994,522 B2
(45) Date of Patent: Aug. 9, 2011

(54) ORGANIC LIGHT EMITTING ELEMENT AND ORGANIC LIGHT EMITTING DEVICE

(75) Inventors: Jae-Kook Ha, Yongin-si (KR); Chang-Woong Chu, Suwon-si (KR); Joo-Hyeon Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 52 days.

(21) Appl. No.: 12/404,871

(22) Filed: Mar. 16, 2009

(65) Prior Publication Data

US 2009/0261354 A1    Oct. 22, 2009

(30) Foreign Application Priority Data

Apr. 18, 2008    (KR) .................. 10-2008-0036223

(51) Int. Cl.
*H01L 29/18*    (2006.01)

(52) U.S. Cl. .................. 257/87; 257/E33.044; 314/504
(58) Field of Classification Search ............. 257/87, 257/E33.044; 313/504
See application file for complete search history.

(56) References Cited

U.S. PATENT DOCUMENTS

2008/0278066 A1 * 11/2008 Spindler et al. ............... 313/504
* cited by examiner

*Primary Examiner* — Hoai v Pham
*Assistant Examiner* — Elias Ullah
(74) *Attorney, Agent, or Firm* — H.C. Park & Associates, PLC

(57) ABSTRACT

The present invention relates to an organic light emitting element and an organic light emitting device including the same. An impurity layer close to an electrode is doped with a small amount, and an impurity layer for a p-n junction is doped with a large amount, such that a high current may flow under a low voltage.

12 Claims, 9 Drawing Sheets

FIG.5

| Experiment Examples | a | b-1 | c-1 | d-1 | a | b-2 | c-2 | d-2 |
|---|---|---|---|---|---|---|---|---|
| Layer | thickness (Å)/weight percent (wt%) | | | | thickness (Å)/weight percent (wt%) | | | |
| Common electrode (270) | 1500 | | | | 1500 | | | |
| n-type impurity layer of an upper light emitting member (391) | 300 14% | | | | 300 14% | | | |
| Upper green sub-emission layer (393G) | 140 8% | | | | 140 8% | | | |
| Upper blue sub-emission layer (393B) | 160 14% | | | | 160 14% | | | |
| Upper red sub-emission layer (393R) | 350 1% | | | | 350 1% | | | |
| p-type impurity layer of an upper light emitting member (392) | 200 | | | | 200 2% | | | |
| | 2% | 6% | 10% | 14% | | | | |
| n-type impurity layer of a lower light emitting member (382) | 200 14% | | | | 200 14% | | | |
| Lower green sub-emission layer (383G) | 140 8% | | | | 140 8% | | | |
| Lower blue sub-emission layer (383B) | 160 14% | | | | 160 14% | | | |
| Lower red sub-emission layer (383R) | 350 1% | | | | 350 1% | | | |
| p-type impurity layer of a lower light emitting member (381) | 800 2% | | | | 800 | | | |
| | | | | | 2% | 6% | 10% | 14% |
| Pixel electrode (191) | 900 | | | | 900 | | | |

FIG.7

| Experiment Examples | a' | b-3 | c-3 | d-3 | a' | b-4 | c-4 | d-4 |
|---|---|---|---|---|---|---|---|---|
| Layer | thickness (Å)/weight percent (wt%) | | | | thickness (Å)/weight percent (wt%) | | | |
| Common electrode (270) | 1500 | | | | 1500 | | | |
| n-type impurity layer of an upper light emitting member (391) | 300 6% | | | | 300 | | | |
| | | | | | 6% | 10% | 14% | 18% |
| Upper green sub-emission layer (393G) | 140 8% | | | | 140 8% | | | |
| Upper blue sub-emission layer (393B) | 160 14% | | | | 160 14% | | | |
| Upper red sub-emission layer (393R) | 350 1% | | | | 350 1% | | | |
| p-type impurity layer of an upper light emitting member (392) | 200 2% | | | | 200 2% | | | |
| n-type impurity layer of a lower light emitting member (382) | 200 | | | | 200 6% | | | |
| | 6% | 10% | 14% | 18% | | | | |
| Lower green sub-emission layer (383G) | 140 8% | | | | 140 8% | | | |
| Lower blue sub-emission layer (383B) | 160 14% | | | | 160 14% | | | |
| Lower red sub-emission layer (383R) | 350 1% | | | | 350 1% | | | |
| p-type impurity layer of a lower light emitting member (381) | 800 2% | | | | 800 2% | | | |
| Pixel electrode (191) | 900 | | | | 900 | | | | ant
ORGANIC LIGHT EMITTING ELEMENT AND ORGANIC LIGHT EMITTING DEVICE

CROSS-REFERENCE TO RELATED APPLICATION

This application claims priority to and the benefit of Korean Patent Application No. 10-2008-0036223, filed on Apr. 18, 2008, which is hereby incorporated by reference for all purposes as if fully set forth herein.

BACKGROUND OF THE INVENTION

1. Field of the Invention

The present invention relates to an organic light emitting element and an organic light emitting device including the same, and particularly to an organic light emitting element including organic light emitting members that are overlapped with a plurality of layers and an organic light emitting device including the same.

2. Discussion of the Background

The recent trend toward lightweight and thin personal computers and television sets has increased the demand for lightweight and thin display devices. Because flat panel displays, such as a liquid crystal display (LCD), satisfy this demand, they are being substituted for conventional cathode ray tubes (CRTs).

However, because the LCD is a passive display device, a light source, such as a back-light, is needed. The LCD may also have various problems such as a slow response time and a narrow viewing angle.

Among flat panel displays, an organic light emitting device has recently been highlighted as a display device for solving these problems.

The organic light emitting device includes a plurality of organic light emitting elements. Each organic light emitting element includes an anode, a cathode, and an organic light emitting member disposed therebetween.

The organic light emitting member may emit white light or a primary color, and it may include an emission layer and an auxiliary layer, such as an electron injection layer, a hole injection layer, an electron transport layer, and a hole transport layer. With an organic light emitting member that emits white light, the emission layer generally has a structure in which emission materials that emit three primary colors, such as red, green, and blue, are deposited.

However, the organic light emitting element may have low emission efficiency and a short lifetime. Also, a high voltage may be required to generate the current that is used to cause light emission.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention provides an organic light emitting element and an organic light emitting device including the same that may increase the emission efficiency and lifetime thereof, and it may be driven at a lower voltage.

Additional features of the invention will be set forth in the description which follows, and in part will be apparent from the description, or may be learned by practice of the invention.

The present invention discloses an organic light emitting element including a first electrode; a first impurity layer of a first conductive type contacting the first electrode; a first light emission layer contacting the first impurity layer; a second impurity layer of a second conductive type contacting the first light emission layer; a third impurity layer of the first conductive type contacting the second impurity layer; a second light emission layer contacting the third impurity layer; a fourth impurity layer of the second conductive type contacting the second light emission layer; and a second electrode contacting the fourth impurity layer. An amount of an impurity doped in the second and third impurity layers is larger than an amount of an impurity doped in the first and fourth impurity layers.

The present invention also discloses an organic light emitting element including a first electrode, a second electrode facing the first electrode, and at least two emission members disposed between the first electrode and the second electrode. The at least two emission members each include a p-type impurity layer, an n-type impurity layer, and an emission layer, and a p-type impurity layer and an n-type impurity layer are in contact with each other to form a p-n junction in portions where the emission members are in contact with each other. When a p-type impurity layer and an n-type impurity layer that are disposed outermost and respectively closest to the first electrode and the second electrode are respectively referred to as an outermost p-type impurity layer and an outermost n-type impurity layer, the amount of the impurity in the p-type impurity layer and the n-type impurity layer forming the p-n junction is larger than the amount of the impurity in the outermost p-type impurity layer and the outermost n-type impurity layer.

The present invention also discloses an organic light emitting device including an organic light emitting element including an anode, a cathode, and an organic light emitting member disposed between the anode and the cathode; a driving transistor connected to the organic light emitting element; a switching transistor connected to the driving transistor; a gate line connected to the switching transistor; and a data line connected to the switching transistor and insulated from the gate line. The organic light emitting member includes a first light emission layer of a multi-layered structure; a second light emission layer of a multi-layered structure; an impurity junction layer having a first surface contacting the first light emission layer, a second surface contacting the second light emission layer, and a multi-layered structure; a hole injection layer having a first surface contacting the anode and a second surface contacting the first emission layer; and an electron injection layer having a first surface contacting the second emission layer and a second surface contacting the cathode. An amount of an impurity doped in the impurity junction layer is larger than an amount of an impurity doped in each of the hole injection layer and the electron injection layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 5 is a view showing layers, thicknesses, and weight percents (wt %) of an organic light emitting diode.

FIG. 7 a view showing layers, thicknesses, and weight percents (wt %) of an organic light emitting diode.

DETAILED DESCRIPTION OF THE ILLUSTRATED EMBODIMENTS

Figure 1:
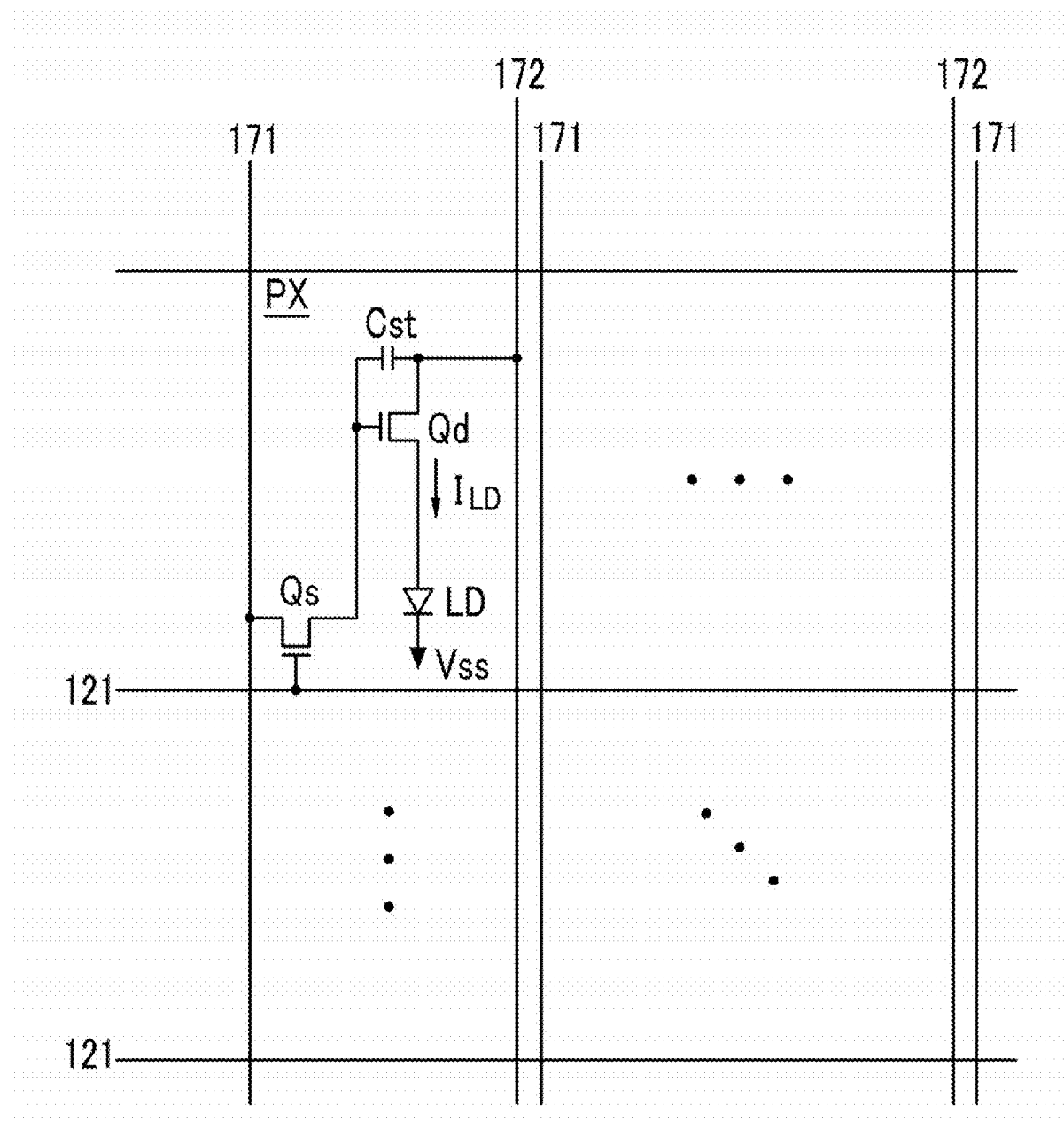
FIG. 1 is an equivalent circuit diagram of an organic light emitting device according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

An organic light emitting device according to an exemplary embodiment of the present invention will be described in detail below with reference to FIG. 1.

FIG. 1 is an equivalent circuit diagram of an organic light emitting device according to an exemplary embodiment of the present invention.

Referring to FIG. 1, an organic light emitting device according to the present exemplary embodiment includes a plurality of signal lines 121, 171, and 172, and a plurality of pixels PX connected thereto and arranged substantially in a matrix.

The signal lines include a plurality of gate lines 121, which transmit gate signals (or scanning signals), a plurality of data lines 171, which transmit data signals, and a plurality of driving voltage lines 172, which transmit a driving voltage. The gate signal lines 121 extend substantially in a row direction and substantially parallel to each other, and the data lines 171 and the driving voltage lines 172 extend substantially in a column direction and substantially parallel to each other.

Each pixel PX includes a switching transistor Qs, a driving transistor Qd, a storage capacitor Cst, and an organic light emitting diode (OLED) LD.

The switching transistor Qs has a control terminal connected to one of the gate lines 121, an input terminal connected to one of the data lines 171, and an output terminal connected to the driving transistor Qd. The switching transistor Qs transmits data signals from the data line 171 to the driving transistor Qd in response to a gate signal from the gate line 121.

The driving transistor Qd has a control terminal connected to the switching transistor Qs, an input terminal connected to the driving voltage line 172, and an output terminal connected to the OLED LD. The driving transistor Qd drives an output current $I_{LD}$ having a magnitude depending on the voltage between the control terminal and the input terminal thereof.

The capacitor Cst is connected between the control terminal and the input terminal of the driving transistor Qd. The capacitor Cst stores a data signal applied to the control terminal of the driving transistor Qd and maintains the data signal after the switching transistor Qs turns off.

The OLED LD has an anode connected to the output terminal of the driving transistor Qd and a cathode connected to a common voltage Vss. The OLED LD emits light having an intensity depending on an output current $I_{LD}$ of the driving transistor Qd, thereby displaying images.

The switching transistor Qs and the driving transistor Qd are n-channel field effect transistors (FETs). However, at least one of the switching transistor Qs and the driving transistor Qd may be a p-channel FET. In addition, the connections among the transistors Qs and Qd, the capacitor Cst, and the organic light emitting diode LD may be modified.

The of the organic light emitting device will be described in detail below with reference to FIG. 2 and FIG. 3, as well as FIG. 1.

Figure 2:
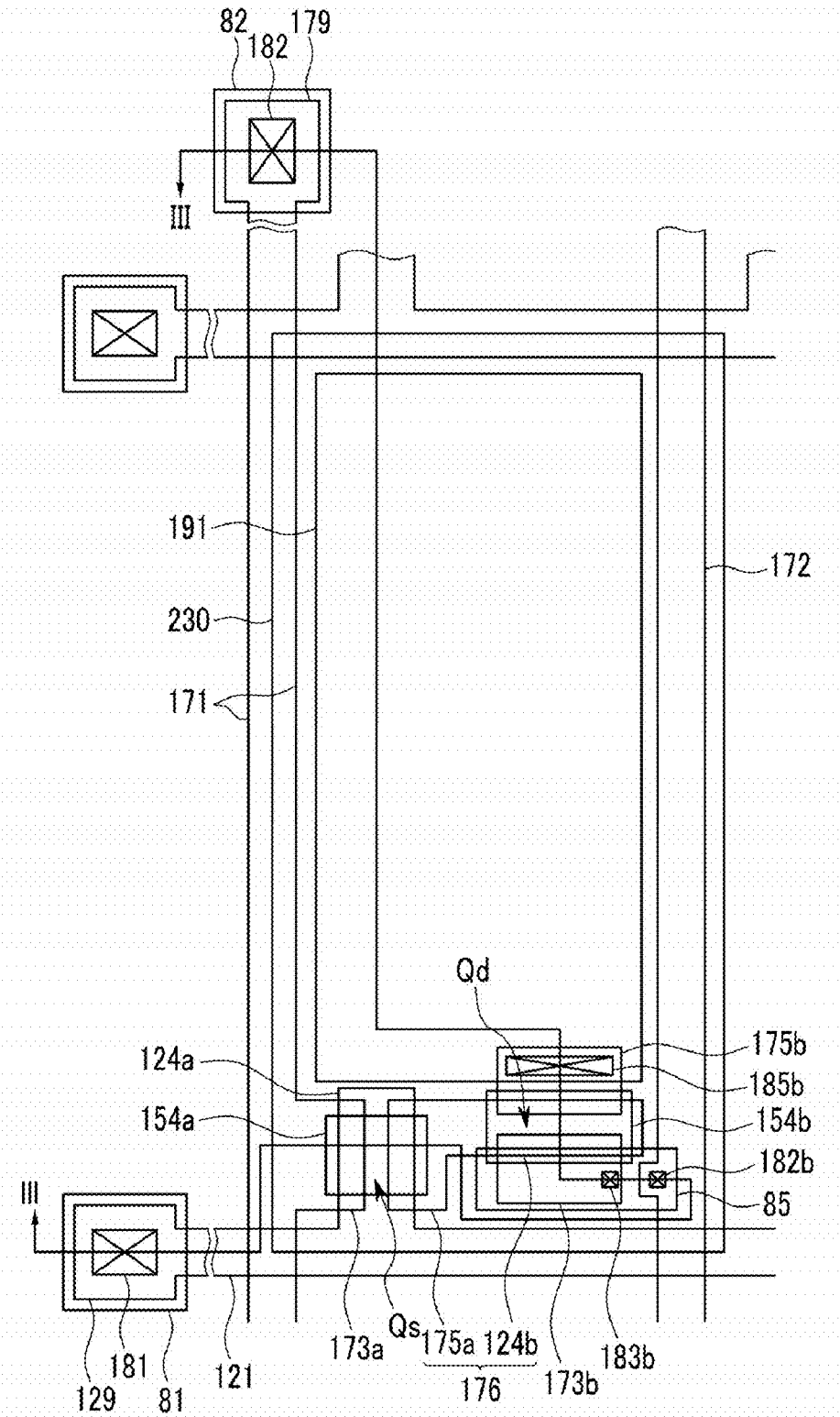
FIG. 2 is a layout view of one pixel in an organic light emitting device according to an exemplary embodiment of the present invention.
Figure 3:
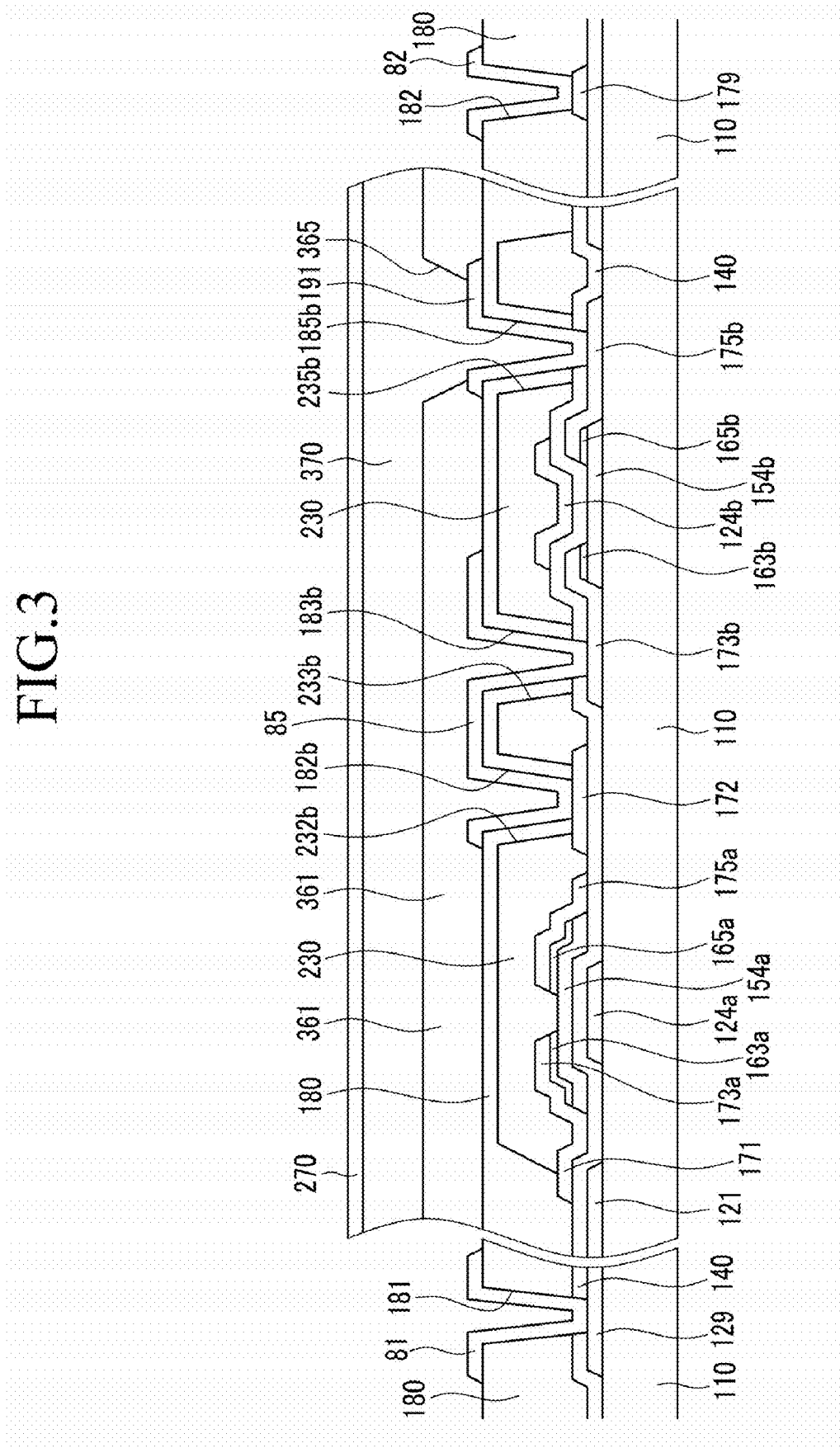
FIG. 3 is a cross-sectional view taken along line III-III of FIG. 2.

FIG. 2 is a layout view of one pixel in an organic light emitting device according to an exemplary embodiment of the present invention, and FIG. 3 is a cross-sectional view taken along line III-III of FIG. 2.

A plurality of semiconductor islands 154b is formed on a substrate 110. The semiconductor islands 154, which are used in driving transistors, may be referred to as "driving semiconductor islands." The driving semiconductor islands 154b may be made of a crystalline semiconductor, such as microcrystalline silicon and polycrystalline silicon.

A plurality of pairs of ohmic contacts ("driving contacts") 163b and 165b, which are for a driving transistor, are formed on the driving semiconductor islands 154b. The driving ohmic contacts 163b and 165b have an island shape, and they may be made of a crystalline semiconductor material such as polysilicon doped with an impurity, microcrystalline silicon heavily doped with an n-type impurity such as phosphorous, or an amorphous semiconductor material.

A plurality of gate lines 121, a plurality of input electrodes 173b for the driving transistors ("driving input electrodes"), and a plurality of output electrodes 175b for the driving transistors ("driving output electrodes") are formed on the substrate 110 and the driving ohmic contacts 163b and 165b.

The gate lines 121 transmit gate signals, and each gate line 121 includes a plurality of control electrodes 124a for switching transistors ("switching control electrodes") projecting upward from the gate line 121, and an end portion 129, which has a large area for contact with another layer or an external driving circuit.

The driving input electrodes 173b and the driving output electrodes 175b are separated from the gate lines 121, and are respectively disposed on the driving ohmic contacts 163b and 165b, and the substrate 110.

A gate insulating layer 140, which may be made of silicon oxide ($SiO_2$) or silicon nitride ($SiN_x$), is formed on the gate lines 121, the driving input electrodes 173b, the driving output electrodes 175b, and exposed portions of the driving semiconductor islands 154b.

A plurality of semiconductor islands 154a, which may be made of hydrogenated amorphous silicon, for the switching transistors ("switching semiconductors") are formed on the gate insulating layer 140. The switching semiconductors 154a are disposed on the switching control electrodes 124a.

A plurality of pairs of ohmic contacts 163a and 165a for the switching transistors ("switching ohmic contacts") are formed on the switching semiconductors 154a. The switching semiconductors 154a have an island shape, and they may be made of a material such as n+ hydrogenated amorphous silicon that is heavily doped with an n-type impurity such as phosphorous.

A plurality of data lines 171, a plurality of driving voltage lines 172, and a plurality of electrode members 176 are formed on the switching ohmic contacts 163a and 163b, and the gate insulating layer 140.

The data lines 171 cross with the gate lines 121. Each data line 171 includes a plurality of input electrodes 173a for the switching transistors ("switching input electrodes"), which extend toward the switching control electrodes 124a, and an end portion 179, which has a large area for contact with another layer or an external driving circuit.

The driving voltage lines 172 cross with the gate lines 121.

The electrode members 176 are separated from the data lines 171 and the driving voltage lines 172. The electrode members 176 respectively include an output electrode 175a for the switching transistor ("a switching output electrode") and a control electrode 124b for the driving transistor ("a driving control electrode").

The switching output electrodes 175a are disposed on the switching ohmic contacts 165a, and the driving control electrodes 124b are disposed on the driving semiconductor islands 154b.

The gate lines 121, the data lines 171, the driving voltage lines 172, and the electrode members 176 may be made of the same material.

A plurality of color filters 230 is formed on the data lines 171, the driving voltage lines 172, the electrode members 176, and the exposed switching semiconductor islands 154a. However, if the organic light emitting device includes a pixel that emits white light, a color filter may not exist in the white pixel, or a transparent color filter (not shown) may be used.

The color filters 230 have a plurality of through holes 232b, 233b, and 235b. The through holes 232b expose the driving voltage lines 172, the through holes 233b expose the driving input electrodes 173b, and the through holes 235b expose the driving output electrodes 175b.

An interlayer insulating layer (not shown) may be formed under the color filters 230. The interlayer insulating layer may prevent pigments of the color filters 230 from flowing into the switching semiconductors 154a.

A passivation layer 180 is formed on the color filters 230, the data lines 171, the driving voltage lines 172, and the electrode members 176.

The passivation layer 180 has a plurality of contact holes 182 exposing end portions 179 of the data lines 171, and a plurality of contact holes 182b exposing the driving voltage line 172 through the through holes 232b. The passivation layer 180 and the gate insulating layer 140 have a plurality of contact holes 181 exposing the end portions 129 of the gate lines 121, a plurality of contact holes 183b exposing the driving input electrodes 173b through the through holes 233b, and a plurality of contact holes 185b exposing the driving output electrodes 175b through the through holes 235b.

A plurality of pixel electrodes 191, a plurality of connecting members 85, and a plurality of contact assistants 81 and 82 are formed on the passivation layer 180.

The pixel electrodes 191 are connected to the driving output electrodes 175b through the contact holes 185b.

The connecting members 85 are connected to the driving voltage lines 172 and the driving input electrodes 173b through the contact holes 182b and 183b, and portions of the connecting members 85 overlap the driving control electrodes 124b to form the storage capacitors Cst.

The contact assistants 81 and 82 are respectively connected to the end portions 129 and 179 of the gate lines 121 and the data lines 171 through the contact holes 181 and 182. The contact assistants 81 and 82 adhere the ends 179 and 129 of the data lines 171 and gate lines 121, respectively, to outside components, and protect them.

The pixel electrodes 191, the connecting members 85, and the contact assistants 81 and 82 may be made of a transparent conductor such as ITO or IZO.

An insulating layer 361 is formed on the pixel electrodes 191 and the connecting members 85. The insulating layer 361 surrounds the edges of the pixel electrodes 191, thereby defining a plurality of openings 365.

An organic light emitting member 370, which emits white light, is formed on the insulating layer 361 and the pixel electrodes 191, and a common electrode 270, which receives the common voltage Vss, is formed on the organic light emitting member 370.

The switching control electrode 124a, the switching input electrode 173a, the switching output electrode 175a, and the switching semiconductor 154a form the switching thin film transistor Qs. The channel of the switching thin film transistor Qs is formed in the switching semiconductor 154a between the switching input electrode 173a and the switching output electrode 175a.

The driving control electrode 124b, the driving input electrode 173b, the driving output electrode 175b, and the driving semiconductor 154b form the driving thin film transistor Qd. The channel of the driving thin film transistor Qd is formed in the driving semiconductor 154b between the driving input electrode 173b and the driving output electrode 175b.

As described above, the switching semiconductor 154a is made of an amorphous semiconductor and the driving semiconductor 154b is made of a crystallized semiconductor such that the characteristics required in each thin film transistor may be simultaneously satisfied. However, the type of semiconductor included in the driving thin film transistor Qd and the switching thin film transistor Qs may differ. For example, both thin film transistors Qd and Qs may include amorphous silicon or crystallized silicon.

In FIG. 2 and FIG. 3, the driving thin film transistor Qd is a top gate type, and the switching thin film transistor Qs is a bottom gate type. However, the two thin film transistors Qd and Qs may have any structure.

According to another exemplary embodiment of the present invention, each pixel PX may include additional transistors to prevent or compensate degradation of the OLED LD and the driving transistor Qd, as well as one switching transistor Qs and one driving transistor Qd.

Next, the organic light emitting member 370 will be described in detail below with reference to FIG. 4.

Figure 4:
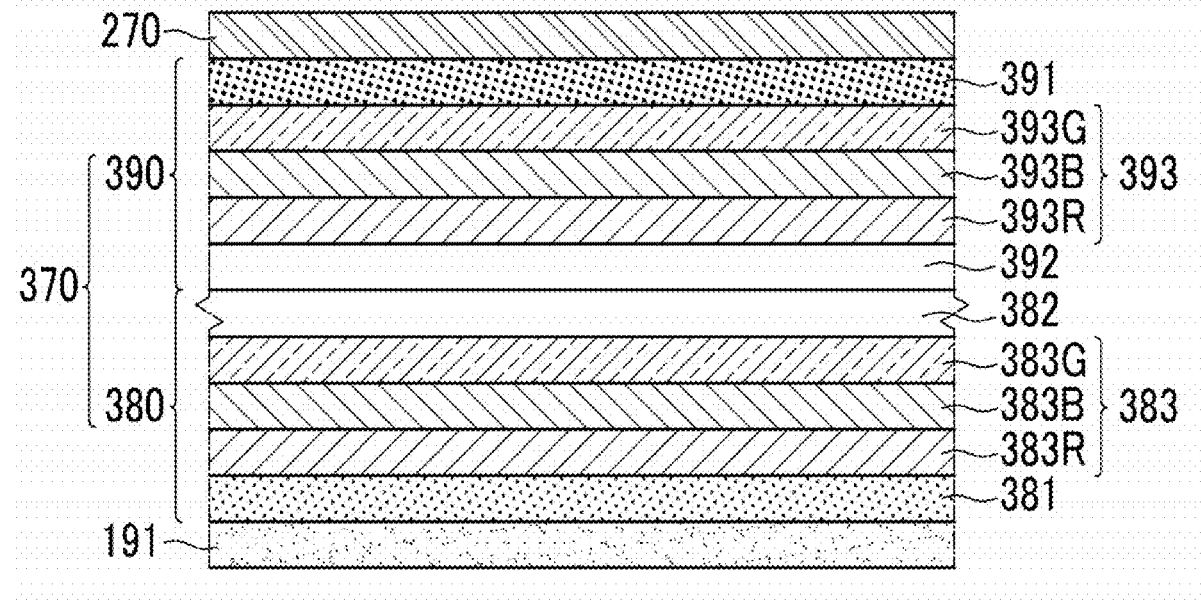
FIG. 4 is a schematic cross-sectional view of an organic light emitting diode according to an exemplary embodiment of the present invention.

As shown in FIG. 4, the organic light emitting member 370 includes a lower light emitting member 380 and an upper light emitting member 390. Exemplary embodiments of the present invention are applied to a structure in which two or more light emitting members are overlapped, and the most basic double overlapping structure, which is shown in FIG. 4, will be described.

The lower light emitting member 380 includes an emission layer 383 and impurity layers 381 and 382 on opposite sides of the emission layer 383. The upper light emitting member 390 includes an emission layer 393 and impurity layers 391 and 392 on opposite sides of the emission layer 393.

The impurity layer 381, which contacts the pixel electrode 191, is a p-type impurity layer, and the impurity layer 382 is an n-type impurity layer. The impurity layer 391, which contacts the common electrode 270, is an n-type impurity layer, and the impurity layer 392 is a p-type impurity layer The n-type impurity layer 382 of the lower light emitting member 380 and the p-type impurity layer 392 of the upper light emitting member 390 contact each other, thereby forming a p-n junction. The n-type impurity layer 382 of the lower light emitting member 380 and the p-type impurity layer 392 of the upper light emitting member 390, which form the p-n junction, may be respectively referred to as p-n junction n-type impurity layer 382 and a p-n junction p-type impurity layer 392.

Here, the p-type impurity layers 381 and 392 may function as hole injection layers, and the n-type impurity layers 382 and 391 may function as electron injection layers.

The two p-type impurity layers 381 and 392 may be made of the same material, or they may be made of different materials. The two n-type impurity layers 382 and 391 may be made of the same material, or they may be made of different materials.

In an exemplary embodiment of the present invention, the p-type impurity layers 381 and 392 may be formed by using one among NPB (N,N'-bis-(1-naphtyl)-N,N'-diphenyl-1,1'-biphenyl-4,4'-diamine), triphenylamine and amine series materials as a host, and doping one among materials such as vanadium pentoxide ($V_2O_5$), tungsten oxide ($WO_3$), molybdenum oxide ($MoO_2$), and tetrafluoro-tetracyanoquinodimethane (F4-TCNQ) as a p type dopant. On the other hand, the n-type impurity layers 382 and 391 may be formed by using one among an oxadiazole series and an $Alq_3$ (aluminum tris(8-hydroxyquinoline)) series material as a host, and doping one among an alkali metal (Li, Ba, Ca etc,) and alkaline earth metal materials such as Mg as a n type dopant.

The emission layers 383/393 include red sub-emission layers 383R/393R, blue sub-emission layers 383B/393B, and green sub-emission layers 383G/393G. The arrangement of the red sub-emission layers 383R/393R, the blue sub-emission layers 383B/393B, and the green sub-emission layers 383G/393G may be changed according to their characteristics. The layer having the lowest emission efficiency among the sub-emission layers 383R, 383B, and 383G and 393R, 393B and 393G may be disposed in the middle, the layer having excellent hole transport capability may be disposed at the side of pixel electrode 191, and the layer having excellent electron transport capability may be disposed at the side of the common electrode 270.

Although the present exemplary embodiment shows an emission layer that displays white by including the red sub-emission layers 383R/393R, the blue sub-emission layers 383B/393B, and the green sub-emission layers 383G/393G, only one among the red sub-emission layers 383R/393R, the blue sub-emission layers 383B/393B, and the green sub-emission layers 383G/393G may be used as the emission layers 383/393. Here, it is preferable that the upper emission layer 393 and the lower emission layer 383 display the same color, and it is not necessary for the color filter 230 to be formed on the substrate 110.

In this organic light emitting device, the pixel electrode 191, the organic light emitting member 370, and the common electrode 270 form the OLED LD, wherein the pixel electrode 191 is an anode and the common electrode 270 is a cathode. Alternatively, the pixel electrode 191 may be the cathode and the common electrode 270 may be the anode. In this case, the inner structure of the organic light emitting member 370 is opposite to the structure shown and described above with reference to FIG. 4.

The emission characteristics of the OLED LD in FIG. 4 change according the amount of impurity doped in the impurity layers 381, 382, 391, and 392. Thus, the impurity amount of each impurity layer 381, 382, 391, and 392 should be appropriately controlled to emit light having optimized efficiency.

Experiments will be described below with reference to FIG. 5, FIG. 6, FIG. 7, FIG. 8, and FIG. 9 to understand the emission efficiency according to the impurity amount.

Figure 6:
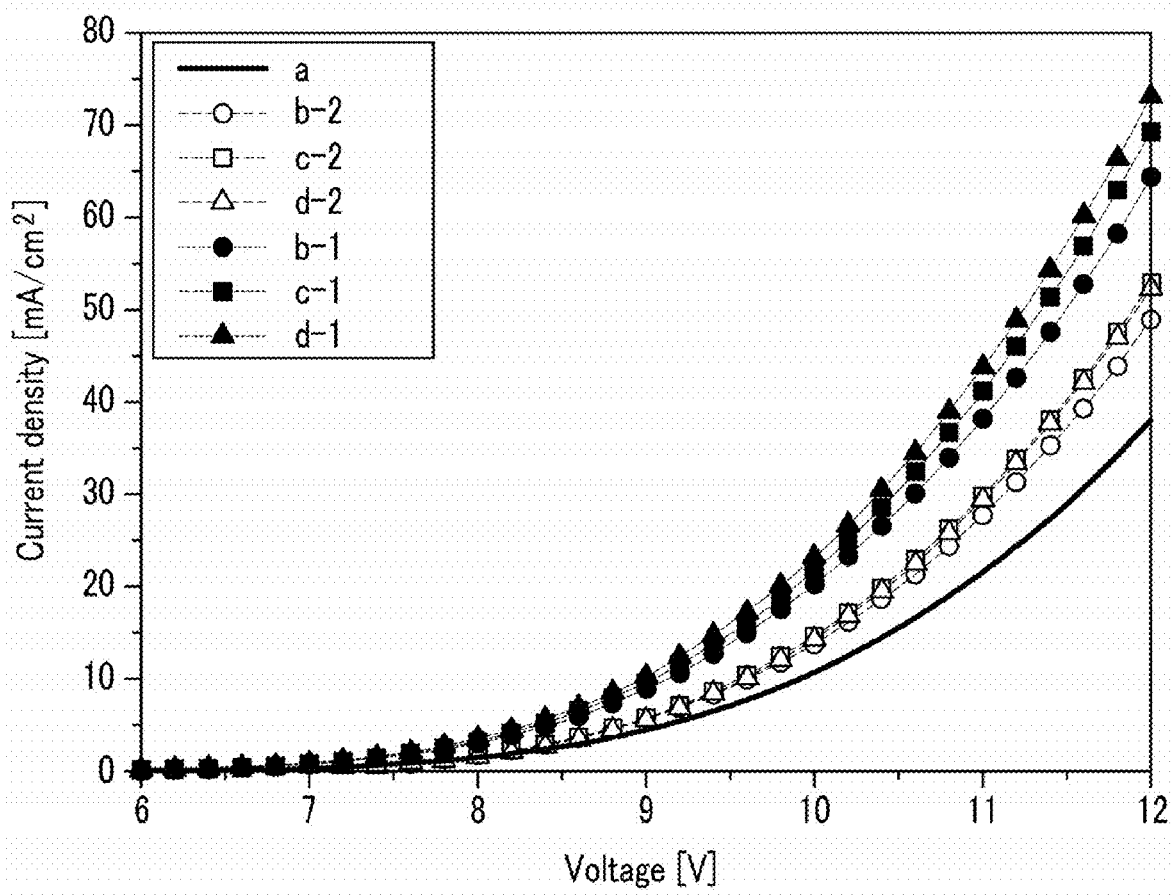
FIG. 6 is a graph of current density versus voltage according to the experimental examples of FIG. 5.

First, FIG. 5 and FIG. 6 are condition and result graphs of experiments showing a current density ($mA/cm^2$) according to an amount (weight percent (wt %)) of a p-type dopant, and FIG. 5 shows each layer, its thickness, and a weight percent (wt %) of the p-type dopant in an organic light emitting diode.

FIG. 5 shows eight experimental examples. In four of the experimental examples (i.e., Experimental Example a, Experimental Example b-1, Experimental Example c-1, and Experimental Example d-1), the current densities ($mA/cm^2$) were measured while changing the weight percent (wt %) of the p-type dopant of the p-n junction p-type impurity layer 392. In the other four experimental examples (i.e., Experimental Example a, Experimental Example b-2, Experimental Example c-2, and Experimental Example d-2), the current densities ($mA/cm^2$) were measured while changing the weight percent (wt %) of the p-type dopant of the p-type impurity layer 381 of the lower light emitting member 380. Although Experimental Example a is shown twice in FIG. 5, it is the same example in which both the p-type dopants of the p-type impurity layer 381 and the p-n junction p-type impurity layer 392 are 2 wt %.

The condition of this experiment will be described through FIG. 5 as below.

First, according to FIG. 5, the pixel electrode 191 is 900 Å thick, the p-type impurity layer 381 is 800 Å thick, the lower red sub-emission layer 383R is 350 Å thick, the lower blue sub-emission layer 383B is 160 Å thick, the lower green sub-emission layer 383G is 140 Å thick, the p-n junction n-type impurity layer 382 is 200 Å thick, the p-n junction p-type impurity layer 392 is 200 Å thick, the upper red sub-emission layer 393R is 350 Å thick, the upper blue sub-emission layer 393B is 160 Å thick, the upper green sub-emission layer 393G is 140 Å thick, the n-type impurity layer 391 is 300 Å thick, and the common electrode 270 is 1,500 Å thick. Further, the pixel electrode 191 is made of IZO, and the common electrode 270 is made of Al.

In addition, according to FIG. 5, the lower red sub-emission layer 383R is doped at 1 wt %, the lower blue sub-emission layer 383B is doped at 14 wt %, the lower green sub-emission layer 383G is doped at 8 wt %, the p-n junction n-type impurity layer 382 is doped at 14 wt %, the upper red sub-emission layer 393R is doped at 1 wt %, the upper blue sub-emission layer 393B is doped at 14 wt %, the upper green sub-emission layer 393G is doped at 8 wt %, and the n-type impurity layer 391 is doped at 14 wt %. Here, the p-type impurity layer 381 of the lower light emitting member 380 and the p-n junction p-type impurity layer 392 of the upper light emitting member 390 are doped with different weight percents per experimental example, and both layers are basically doped at 2 wt % in Experimental Example a.

First, the p-n junction p-type impurity layer 392 of the upper light emitting member 390 is respectively doped at 6 wt % in Experimental Example b-1, 10 wt %, in Experimental Example c-1, and 14 wt % in Experimental Example d-1, and the p-type impurity layer 381 of the lower light emitting member is doped at 2 wt %. On the other hand, the p-type impurity layer 381 of the lower light emitting member 380 is respectively doped at 6 wt % in Experimental Example b-2, 10 wt % in Experimental Example c-2, and 14 wt % in Experimental Example d-2, and the p-n junction p-type impurity layer 392 of the upper light emitting member 390 is doped at 2 wt %.

FIG. 6 is a graph showing the current density versus the voltage according to each experimental example of FIG. 5.

As shown in FIG. 6, the current density changes the most with respect to a change of the voltage in Experimental Example d-1, and the current density changes the least in Experimental Example a. If the change in magnitude of the current density is sequentially described, it is the sequence of Experimental Example d-1>Experimental Example c-1>Experimental Example b-1>Experimental Example d-2>Experimental Example c-2>Experimental Example b-2>Experimental Example a.

FIG. 6 informs the fact as follows.

The current greatly flows for a small voltage according to the increasing of the doping amount (i.e., weight percent) of the p-type impurity layer 381 of the lower light emitting member 380 and the p-n junction p-type impurity layer 392 of the upper light emitting member 390. Among these, the current density is more sensitively increased to the impurity amount doped to the p-n junction p-type impurity layer 392 than the p-type impurity layer 381.

As a result, the p-n junction p-type impurity layer 392 may be more doped than the p-type impurity layer 381 so that a large current may flow in the OLED LD for a small voltage, thereby improving emission efficiency.

Also, in experimental example d-1, the p-n junction p-type impurity layer 392 of the upper light emitting member 390 is doped at 14 wt %; however, it may be recognized that better efficiency may be obtained beyond this doping amount through this experiment.

On the other hand, if the doping amount of the p-type impurity layer 381 and the p-n junction p-type impurity layer 392 are increased, the current may excessively flow in the OLED LD such that the lifetime of the OLED LD may be reduced. Also, if the current excessively flows in the OLED LD, the value of current for the change in voltage excessively changes such that it is difficult to control the desired emission luminance.

Therefore, to solve this problem, the doping amount may be reduced in the p-type impurity layer 381 of the lower light emitting member 380 and the doping amount of the p-n junction p-type impurity layer 392 of the upper light emitting member 390 may be increased. That is, the p-type impurity layer 381 may be doped at less than 10 wt %, and the p-n junction p-type impurity layer 392 may be doped at more than 14 wt %, such that the doping amount of the p-type impurity may be optimized.

The relation between the doping amount of a p-type impurity and the current density was described above. Next, the doping amount of an n-type impurity and the current density will be described below with reference to FIG. 7 and FIG. 8.

Figure 8:
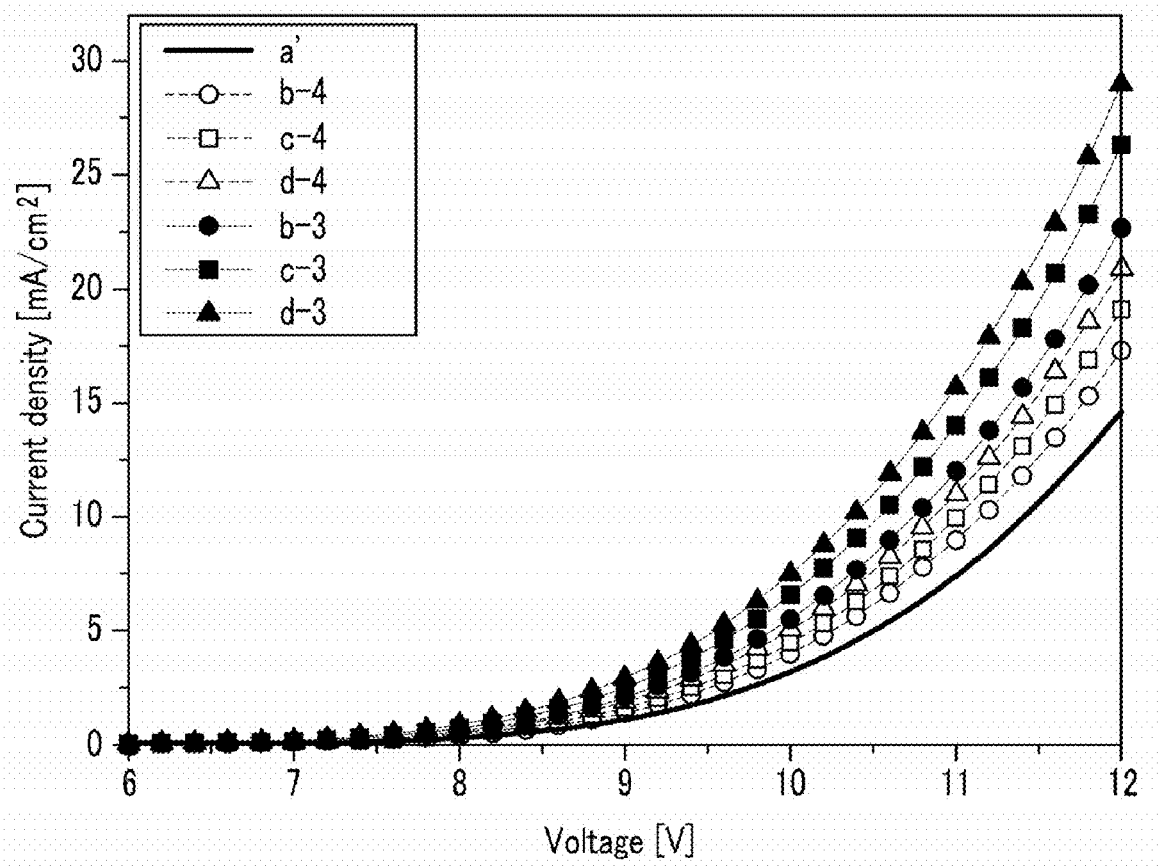
FIG. 8 is a graph of a current density versus voltage according to the experimental examples of FIG. 7.

FIG. 7 and FIG. 8 show condition and result graphs of the current density according to an amount of an n type dopant.

FIG. 7 shows each layer, its thickness, and a weight percent (wt %) of the n-type dopant in an organic light emitting diode.

FIG. 7 shows eight experimental examples. In four of the experimental examples (i.e., Example a', Experimental Example b-3, Experimental Example c-3, and Experimental Example d-3), the current densities (mA/cm$^2$) were measured while changing the weight percent (wt %) of the n-type dopant of the p-n junction n-type impurity layer 382. In the other four experimental examples (i.e, Experimental Example a', Experimental Example b-4, Experimental Example c-4, and Experimental Example d-4), the current densities (mA/cm$^2$) were measured while changing the weight percent (wt %) of the n-type dopant of the n-type impurity layer 391 of the upper light emitting member 390.

The conditions of this experiment will be described below with reference to FIG. 7. However, the layers in the experimental examples of FIG. 7 have the same thicknesses as in the experimental examples of FIG. 5. Thus, descriptions thereof are omitted. In these experimental examples, the pixel electrode 191 is made of IZO, and the common electrode 270 is made of Al.

The doping amount of each layer according to the experimental examples of FIG. 7 will be described below.

The p-type impurity layer 381 is doped at 2 wt %, the lower red sub-emission layer 383R is doped at 1 wt %, the lower blue sub-emission layer 383B at is doped 14 wt %, the lower green sub-emission layer 383G is doped at 8 wt %, the p-n junction p-type impurity layer 392 is doped at 2 wt %, the upper red sub-emission layer 393R is doped at 1 wt %, the upper blue sub-emission layer 393B is doped at 14 wt %, and the upper green sub-emission layer 393G is doped at 8 wt %. Here, the p-n junction n-type impurity layer 382 of the lower light emitting member 380 and the n-type impurity layer 391 of the upper light emitting member 390 are doped with different weight percents per experimental example. First, the p-n junction n-type impurity layer 382 is respectively doped at 6 wt % in Experimental Example a', at 10 wt % in Experimental Example b-3, at 14 wt % in Experimental Example c-3, and at 18 wt % in Experimental Example d-3, and the n-type impurity layer 391 is doped at 6 wt %. On the other hand, the n-type impurity layer 391 is respectively doped at 6 wt % in Experimental Example a', at 10 wt % in Experimental Example b-4, at 14 wt % in Experimental Example c-4, and at 18 wt % in Experimental Example d-4, and the p-n junction n-type impurity layer 382 is doped at 6 wt %.

FIG. 8 is a graph showing the current density versus the voltage according to each experimental example of FIG. 7.

As shown in FIG. 8, the current density changes the most with respect to a change of the voltage in Experimental Example d-3, and the current density changes the least in Experimental Example a'. If the change in magnitude of the current density is sequentially described, it is in the sequence of Experimental Example d-3>Experimental Example c-3>Experimental Example b-3>Experimental Example d-4>Experimental Example c-4>Experimental Example b-4>Experimental Example a'.

FIG. 8 informs the fact as follows.

The current greatly flows for a small voltage according to the increasing of the doping amount (i.e., weight percent) of the n-type impurity layer 391 of the upper light emitting member 390, and the p-n junction n-type impurity layer 382 of the lower light emitting member 380. Among these, the current density is more sensitively increased with respect to the impurity amount doped to the p-n junction n-type impurity layer 382 than with respect to the n-type impurity layer 391.

As a result, the p-n junction n-type impurity layer 382 may be more doped than the n-type impurity layer 391 so that a large current may flow in the OLED LD for a small voltage, thereby improving emission efficiency.

Also, in experimental example d-3, the p-n junction n-type impurity layer 382 of the lower light emitting member 380 is doped at 18 wt %; however, it may be recognized that better efficiency may be obtained beyond this doping amount through this experiment.

On the other hand, if the doping amount of the n-type impurity layer 391 and the p-n junction n-type impurity layer 382 are increased, the current may excessively flow in the organic light emitting diode LD such that the lifetime of the OLED LD may be reduced. Also, if the current excessively flows in the OLED LD, the value of current for a change of voltage excessively changes such that it is difficult to control the desired emission luminance.

Therefore, to solve this problem, the doping amount may be reduced in the n-type impurity layer 391 of the lower light emitting member 380 and the doping amount of the p-n junction n-type impurity layer 382 of the upper light emitting member 390 may be increased. That is, the n-type impurity layer 391 may be doped at less than 10 wt %, and the p-n junction n-type impurity layer 382 may be doped at more than 18 wt %, such that the doping amount of the n-type impurity may be optimized.

Figure 9:
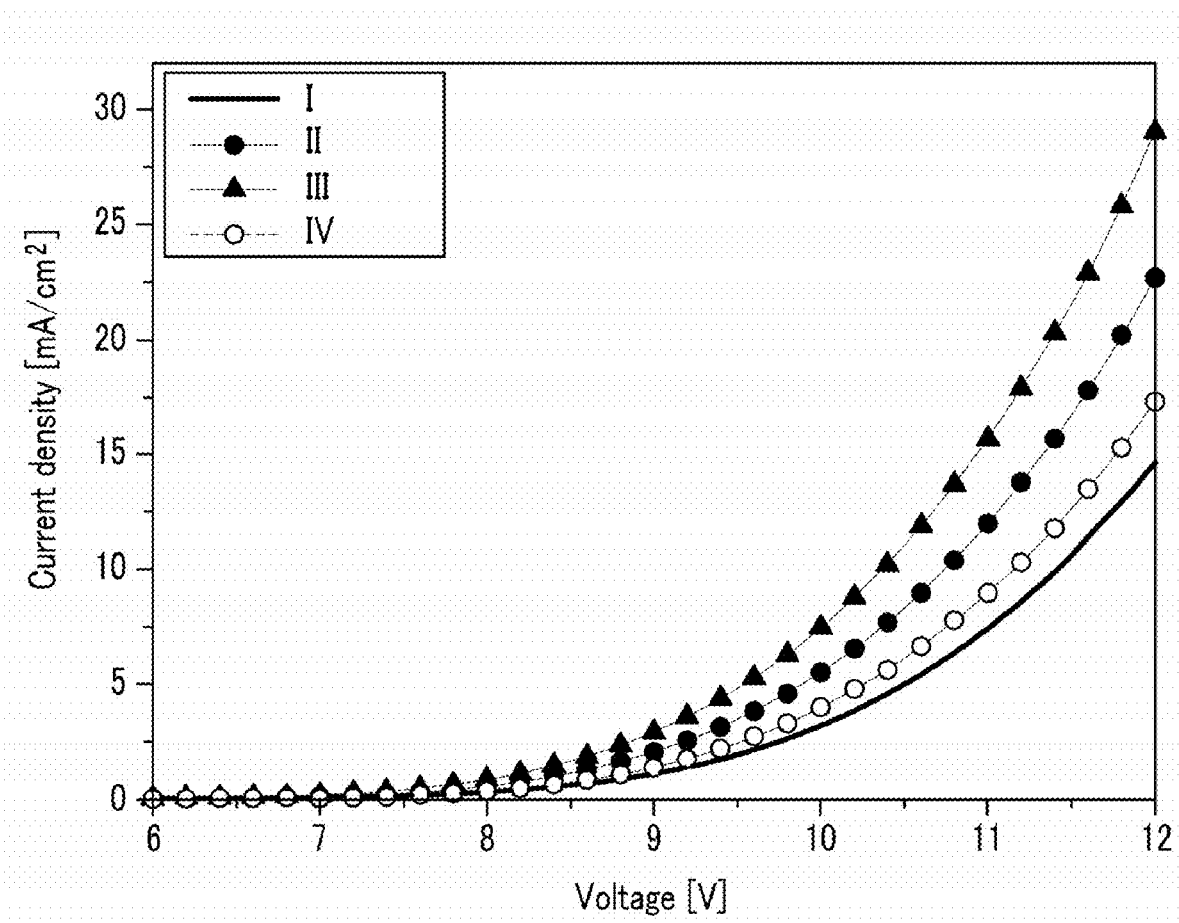
FIG. 9 is a graph of a current density versus voltage according to other experimental examples.

FIG. 9 is a graph showing current density versus voltage according to another experimental example.

FIG. 9 shows experimental results for comparing and examining the doping amount of the p-n junction n-type impurity layer 382 of the lower light emitting member 380 on the side of the p-n junction and the n-type impurity layer 391 of the upper light emitting member 390 on the side of the common electrode 270 by controlling the doping amount of the n-type impurity, and the current density according thereto.

TABLE 1

| Experimental Example | Doping amount (wt %) of a n-type impurity layer 382 of a lower light emitting member | Doping amount (wt %) of a n-type impurity layer 391 of an upper light emitting member |
|---|---|---|
| I | 6 | 6 |
| II | 10 | 6 |
| III | 18 | 6 |
| IV | 6 | 10 |

Table 1 shows layers and doping amounts for each of Experimental Examples I, II, III, and IV of FIG. 9.

First, the doping amount of the n-type impurity layer 391 of the upper light emitting member 390 is uniformly 6 wt % and the doping amount of the p-n junction n-type impurity layer 382 is respectively changed to 6, 10, and 18 wt %. If the experimental results are examined, Experimental Examples I, II, and III have higher current densities for the voltages.

If the doping amount of the p-n junction n-type impurity layer 382 is uniformly 6 wt % and the doping amount of the n-type impurity layer 391 is respectively changed to 6 and 10 wt %, if the experimental results are examined, Experimental Examples I and IV have higher current densities for the voltages.

That is, if the amount of the doped impurity of each layer is increased, it is confirmed that the current density is increased; however, when the same doping amount is injected, it may be confirmed that the doping of the p-n junction n-type impurity layer 382 may more effectively improve the current density than the doping of the n-type impurity layer 391.

Also, the maximum weight percent wt % of the n-type impurity is 18 wt % in the experiment of FIG. 9; however, it may be recognized that if an amount beyond this is doped, better efficiency may appear through the experiments.

Therefore, the experimental results of FIG. 5, FIG. 6, FIG. 7, FIG. 8, and FIG. 9 will be summarized below.

If the doping amounts of the impurity layers 381, 382, 391, and 392 of the OLED LD are increased, the amount of current flowing in the OLED LD for the same voltage is increased. However, if the current excessively flows in the OLED LD, the drawbacks that the consumption amount of the current is increased and the lifetime of the elements is reduced are generated. Also, the change in current due to the change in voltage increases such that it is difficult to control the current in the OLED LD through the data voltage in one pixel.

Accordingly, the doping amount of the impurity layers 381, 382, 391, and 392 of the OLED LD may be treated as follows to eliminate these drawbacks.

First, the doping amount of the impurity layers 381 and 391 may be decreased, and the doping amount of the impurity layers 382 and 392, which form the p-n junction, may be increased. That is, at least the doping amount (correctly, the weight percent) of the impurity layers 382 and 392 may be larger compared with the doping amount (correctly, the weight percent) of the impurity layers 381 and 391.

By doping in this way, a low voltage may provide for a sufficient amount of current flowing in the OLED LD, such that low voltage driving is possible.

Referring to FIG. 5 and FIG. 6, the p-type impurity layer 381 of the lower light emitting member 380 may be doped at less than 10 wt %, and the p-n junction p-type impurity layer 392 of the upper light emitting member 390 may be doped at more than 14 wt %. Also, referring to FIG. 7 and FIG. 8, the n-type impurity layer 391 of the upper light emitting member 390 may be doped at less than 10 wt %, and the p-n junction n-type impurity layer 382 of the lower light emitting member 380 may be doped at more than 18 wt %.

To sum up: the impurity layers 382 and 392 forming the p-n junction may be doped at more than at least 14 wt %, preferably more than 18 wt %, and the impurity layers 381 and 391 may be doped at less than 10 wt %.

Accordingly, an excessive amount of current may not flow in the organic light emitting device, and the lifetime of the OLED LD may not be reduced.

Only the minimum doping weight percent is described for the impurity layers 382 and 392 forming the p-n junction, but the maximum doping weight percent is not limited. This is the reason that the various exemplary embodiments may be applied according to the characteristics of the organic light emitting device, and the impurity layers 382 and 392 forming the p-n junction are apart from the electrodes 191 and 270 such that even if the doping weight percent is increased, the problem such as the leakage current is not generated.

As above-described, the control of the doping amount may be applied to an organic light emitting device of the different structure from FIG. 1 to FIG. 3.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting element, comprising:
a first electrode;

a first impurity layer of a first conductive type contacting the first electrode;
a first light emission layer contacting the first impurity layer;
a second impurity layer of a second conductive type contacting the first light emission layer;
a third impurity layer of the first conductive type directly contacting the second impurity layer;
a second light emission layer contacting the third impurity layer;
a fourth impurity layer of the second conductive type contacting the second light emission layer; and
a second electrode contacting the fourth impurity layer,
wherein an amount of an impurity doped in the second and third impurity layers is larger than an amount of an impurity doped in the first and fourth impurity layers.

2. The organic light emitting element of claim 1, wherein the amount of the impurity is determined with reference to a value of a weight percent (wt %).

3. The organic light emitting element of claim 2, wherein the first impurity layer and the fourth impurity layer are doped with the impurity at less than 10 wt %, and the second impurity layer and the third impurity layer are doped with the impurity at more than 18 wt %.

4. The organic light emitting element of claim 1, wherein:
the first light emission layer and the second light emission layer each comprise at least two sub-emission layers that emit light of different colors; and
a combination of the light emitted from the at least two sub-emission layers in the first light emission layer and the second light emission layer is white.

5. The organic light emitting element of claim 1, wherein the first light emission layer and the second light emission layer emit light of the same primary color.

6. The organic light emitting element of claim 1, wherein the first impurity layer and the third impurity layer are p-type hole injection layers.

7. The organic light emitting element of claim 6, wherein the first impurity layer and the third impurity layer are doped by a dopant of one among vanadium pentoxide ($V_2O_5$), tungsten oxide ($WO_3$), molybdenum oxide ($MoO_2$), and tetrafluoro-tetracyano-p-quinodimethane (F4-TCNQ) to one material of NPB, triphenylamine, and an amine series.

8. The organic light emitting element of claim 1, wherein the second impurity layer and the fourth impurity layer are n-type electron injection layers.

9. The organic light emitting element of claim 8, wherein the second impurity layer and the fourth impurity layer are doped by a dopant of one of an alkali metal and an alkali earth metal to one of an oxadiazole series and aluminum tris(8-hydroxyquinoline) (Alq3) series.

10. The organic light emitting element of claim 1, wherein the first electrode comprises a pixel electrode comprising indium zinc oxide or indium tin oxide, and the second electrode comprises a common electrode comprising aluminum.

11. An organic light emitting element, comprising:
a first electrode;
a second electrode facing the first electrode; and
at least two emission members disposed between the first electrode and the second electrode,
wherein the at least two emission members each comprise a p-type impurity layer, an n-type impurity layer, and an emission layer,
the p-type impurity layer of a first emission member and the n-type impurity layer of a second emission member directly contact each other to form a p-n junction,
the p-type impurity layer of the second emission member and the n-type impurity layer of the first emission member are disposed respectively closest to the first electrode and the second electrode, and
an amount of the impurity in the p-type impurity layer of the first emission member and the n-type impurity layer of the second emission member is larger than an amount of the impurity in the p-type impurity layer of the second emission member and the n-type impurity layer of the first emission member.

12. The organic light emitting element of claim 11, wherein the impurity is doped at less than 10 wt % in the p-type impurity layer of the second emission member and the n-type impurity layer of the first emission member, and the impurity is doped at more than 18 wt % in the p-type impurity layer of the first emission member and the n-type impurity layer of the second emission member.

* * * * *